US007672825B2

(12) United States Patent
Brouwer et al.

(10) Patent No.: US 7,672,825 B2
(45) Date of Patent: Mar. 2, 2010

(54) CLOSED LOOP CONTROL SYSTEM FOR CONTROLLING PRODUCTION OF HYDROCARBON FLUID FROM AN UNDERGROUND FORMATION

(75) Inventors: Dirk Roelof Brouwer, Rijswijk (NL); Johan Dirk Jansen, Rijswijk (NL); Pieter Karel Anton Kapteijn, Rijswijk (NL); Cornelis Petrus Josephus Walthera Van Kruijsdijk, Delft (NL); Renato Markovinovic, Delft (NL)

(73) Assignee: Shell Oil Company, Houston, TX (US)

( * ) Notice: Subject to any disclaimer, the term of this patent is extended or adjusted under 35 U.S.C. 154(b) by 403 days.

(21) Appl. No.: 11/630,460

(22) PCT Filed: Jun. 23, 2005

(86) PCT No.: PCT/EP2005/052954

§ 371 (c)(1),
(2), (4) Date: Oct. 1, 2007

(87) PCT Pub. No.: WO2006/003118

PCT Pub. Date: Jan. 12, 2006

(65) Prior Publication Data
US 2009/0166033 A1 Jul. 2, 2009

(30) Foreign Application Priority Data
Jun. 25, 2004 (EP) .................................. 04102967

(51) Int. Cl.
*G06G 7/48* (2006.01)
*G06F 17/10* (2006.01)
(52) U.S. Cl. .................. 703/10; 702/13; 703/2
(58) Field of Classification Search .............. 703/2, 703/9, 10; 702/6, 11–13
See application file for complete search history.

(56) References Cited

U.S. PATENT DOCUMENTS 5,992,519 A 11/1999 Ramakrishnan et al. .............. 166/250.15

(Continued)

FOREIGN PATENT DOCUMENTS

| WO | 0162603 | 8/2001 |
| WO | 02086277 | 10/2002 |

OTHER PUBLICATIONS

T. Heijn, R. Markovinovic, J.D. Jansen: "Generation of low-order reservoir models using system-theoritical concepts", Society of Petroleum Engineers, No. 79674, Feb. 3, 2003, pp. 1-11.

(Continued)

*Primary Examiner*—Russell Frejd

(57) ABSTRACT

A method is disclosed for controlling production of oil and/or gas from an underground reservoir by means of a closed loop production control system, in which: an assembly of monitoring sensors (4) monitor the physical properties of hydrocarbon and other fluids within the reservoir; a plurality of high order and/or low order mathematical reservoir models (5,7) calculate each an estimate of the physical properties of hydrocarbon and other fluids in the hydrocarbon containing formation and in the wells; the mathematical reservoir models (5,7) are iteratively updated in response to data provided by the assembly of sensors such that any difference between the properties monitored by the assembly of sensors and those calculated by each of the reservoir models is minimized; an optimal mathematical reservoir model (5,7) or an optimal combination thereof is selected during at least one updating step for which an averaged difference between the calculated properties and the properties monitored by the assembly of sensors (4) is minimal; and an optimization algorithm (8) controls, on the basis of data provided by the selected optimal mathematical reservoir model or optimal combination thereof, production control assemblies of a plurality of wells which traverse the formation.

12 Claims, 1 Drawing Sheet

U.S. PATENT DOCUMENTS

| | | |
|---|---|---|
| 6,266,619 B1 | 7/2001 | Thomas et al. ................. 702/13 |
| 6,434,435 B1 | 8/2002 | Tubel et al. .................... 700/30 |
| 2002/0100584 A1 | 8/2002 | Couet et al. ............ 166/250.15 |

OTHER PUBLICATIONS

D.R. Brouwer, G. Naevdal, J.D. Jansen, E.H. Vefring, C.P.J. W. Van Kruijsdijk: "Improved reservoir management through optimal control and continujous model updating", Society of Petroleum Engineers, No. 90149, Sep. 2004, pp. 1-11.

P. Sarma, L.J. Durlofsky and K. Aziz: "Efficient closed-loop production optimization under uncertainty", Society of Petroleum Engineers, No. 94241, Jun. 13, 2005, pp. 1-14.

X.H. Wen, W.H. Chen: "Real-time reservoir model updating using ensemble Kalman filter", Society of Petroleum Engineers, No. 92991, Jan. 31, 2005, Feb. 2, 2005, pp. 1-14.

Sanjay Srinivasan and Steven Bryant: "Integrating dynamic data in reservoir models using a parallel computational approach", Society of Petroleum Engineers, No. 89444, Apr. 17-Apr. 21, 2004, pp. 1-13.

G.L. Chierici: "Economically improving oil recovery by advanced reservoir management", Jrnl. of Petroleum Science Technology, 8, 1992, pp. 205-219.

R.G. Smith and G.C. Maitland: "The road ahead to real-time oil and gas reservoir management", Trans IChemE, vol. 76, Part A, Jul. 1998, pp. 539-552.

Alan Beamer: "From pore to pipeline, field-scale solutions", Oilfield Review, Summer 1998, pp. 2-19.

F. Nyhavn, and F. Vassenden: "Reservoir drainage with downhole permanent monitoring and control systems. Real-time integration of dynamic reservoir performance data and static reservoir model improves control decisions", 2000 SPE Annual Technical Conference and Exhibition, Dallas, Texas, Oct. 1-4, 2000.

D.J. Rossi,O. Gurpinar, R. Nelson, S. Jacobsen: "Discussion on integrating monitorino data into the reservoir management process", 2000 Society of Petroleum Engineers European Petroleum Conference, Paris, France, Oct. 24-25, 2000.

O Nygard, C Kramer, R Kulkarni, J K Nordtvedt: "Development of a marginal gas-condensate field using a novel integrated reservoir and production management approach", 2001 Society of Petroleum Engineer Asia Pacific Oil and Gas Conference, Jakarta, Indonesia, Apr. 17-19, 2001.

P K A Kapteijn: "Smart fields:how to generate more value from hydrocarbon resources", $17^{th}$ World Petroleum Congress,Rio de Janeiro, Brazil, Sep. 1-5, 2002.

L Saputelli, M Nikolaou, M J Economides: "Self-learning reservoir management", 2003 Society of Petroleum Annual Technical Conference Denver, Colorado, Oct. 5-8, 2003.

G Naevdal, T Mannseth, E H Vefring: "Near-well reservoir monitoring through ensemble kalman filter", 2002 Society of Petroleum Engineers/DOE Improved Oil Recovery Symposium, Tulsa, Oklahoma Apr. 13-17, 2002.

G Naevdal, L M Johnsen, S I Aanonsen, E H Vefring: "Reservoir monitoring and continuous model updating using ensemble kalman filter", 2003 SPE Annual Technical Conference, Denver, Colorado, Oct. 5-8, 2003.

D R Brouwer, J D Jansen: "Dynamic optimization of water flooding with smart wells using optimal control theory", SPE $13^{th}$ European Petroleum Conference, Aberdeen, Scotland, U.K. Oct. 29-31, 2002.

CLOSED LOOP CONTROL SYSTEM FOR CONTROLLING PRODUCTION OF HYDROCARBON FLUID FROM AN UNDERGROUND FORMATION

PRIORITY CLAIM

The present application claims priority on European Patent Application 04102967.9 filed 25 Jun. 2004.

FIELD OF THE INVENTION

The invention relates to a method of controlling production of hydrocarbon fluid, such as crude oil and/or natural gas, from an underground hydrocarbon containing formation by means of a production control system.

BACKGROUND OF THE INVENTION

Such a method is known from International patent applications WO01/62603 and WO02/086277, U.S. Pat. Nos. 6,266,619 and 6,775,578, US patent application US 2002/0100584 and from the following papers:

"Economically improving oil recovery by advanced reservoir management," published by G. L. Ghiericiby in the Journal of Petroleum Science Technology. 8 (1992) 205-219, "The road ahead to real-time oil and gas reservoir management" published by R. G. Smith and G. C. Maitland in Trans. Inst. Chem. 76A (July 1998) 539-552.

"From pore to pipeline, field-scale solutions," published by A. Beamer et al. in Oilfield Review (Summer 1998), 2-19.

"Reservoir drainage with down hole permanent monitoring and control systems. Real-time integration of dynamic reservoir performance data and static reservoir model improves control decisions," paper SPE 62937 presented by F. Nyhavn et al. at the 2000 SPE Annual Technical Conference and Exhibition, Dallas, Tex., USA, 1-4 October.

"Discussion on integrating monitoring data into the reservoir management process," paper SPE 65150 presented by D. J. Rossi et al. at the SPE European Petroleum Conference, Paris, France, 24-25 Oct. 2000.

"Development of a marginal gas-condensate field using a novel integrated reservoir and production management approach," paper SPE 68734 presented by Nygard et al. at the SPE Asia Pacific Oil and Gas Conference and Exhibition, Jakarta, Indonesia, 17-19 Apr. 2001.

"Smart fields: How to generate more value from hydrocarbon resources" presented by P. K. A. Kapteijn at the 17th World Petroleum Congress, Rio de Janeiro, Brazil, 1-5 Sep. 2002, 2, 307-316.

"Self-learning reservoir management," paper SPE 84064 presented by L. Saputelli et al. at the 2003 SPE Annual Technical Conference and Exhibition, Denver, Colo., USA, 5-8 October.

These publications disclose the concept of controlling the flow of hydrocarbons based on a model that is regularly updated using measured data. A problem associated with the concept disclosed in these publications is either that they do not teach how the necessary computations are performed, or it is proposed to use high-order (large scale) computer models which are very time-consuming. Another problem in using such high-order computer models is that they contain more parameters than can be uniquely determined from a limited amount of measurements. As a result these updated high-order models are only of limited value to be used for the control of hydrocarbon flow.

SPE paper 79674, "Generation of Low-Order Reservoir Models using System-Theoretical Concepts", presented at the SPE Reservoir Simulation Symposium in Houston, Tex., USA, 3-5 Feb. 2003 by T. Heijn, R. Markovinovic, and J. D. Jansen discloses five methods to derive low-order numerical models of two-phase (oil-water) reservoir flow from a high order reservoir model with the aim to develop computationally efficient algorithms for history matching, optimization and the design of control strategies for smart wells. SPE paper 79674 indicates that a reservoir model is called a high-order model if it consists of a large number, typically $10^3$-$10^6$ of variables (pressures and saturations) and that optimization using high-order reservoir models is computationally very intensive and that there is a need to reduce high-order reservoir models to low order reservoir models, which typically have $10^1$-$10^3$ variables, before use in optimization. However, SPE paper 79674 does not teach how the reduction methods can be used in combination with updating techniques and optimization techniques for the control of hydrocarbon flow in the subsurface.

U.S. Pat. No. 5,992,519 discloses a method for automated control of a reservoir on the basis of a reservoir model. A disadvantage of this method is that the selected reservoir model may be less accurate than alternative high order and/or low order reservoir models, and that in the course of time the most accurate mathematical reservoir model may be different from a mathematical reservoir model that most accurately reflected the flux of fluid and/or other fluid properties during an earlier phase of production of hydrocarbon fluids from the reservoir.

SUMMARY OF THE INVENTION

In accordance with the invention there is provided a method of controlling production of hydrocarbon fluid from an underground hydrocarbon containing formation by means of a closed loop production control system in which:
 an assembly of monitoring sensors monitor the flux and/or other physical properties of hydrocarbon and other fluids which traverse the underground hydrocarbon containing formation;
 a plurality of mathematical reservoir models calculate each an estimate of the flux and/or other physical properties of hydrocarbon and other fluids within the hydrocarbon containing formation;
 the mathematical reservoir models are each iteratively updated in response to data provided by the assembly of sensors such that any difference between the properties monitored by the assembly of sensors and those calculated by each of the reservoir models is minimized;
 an optimal mathematical reservoir model or an optimal combination of mathematical reservoir models is selected during at least one updating step for which an averaged difference between the calculated properties and the properties monitored by the assembly of sensors is minimal; and
 an optimization algorithm controls, on the basis of data provided by the selected optimal mathematical reservoir model or optimal combination of mathematical reservoir models, production control assemblies of a plurality of wells which traverse the hydrocarbon containing formation.

DETAILED DESCRIPTION OF THE INVENTION

Figure 1:
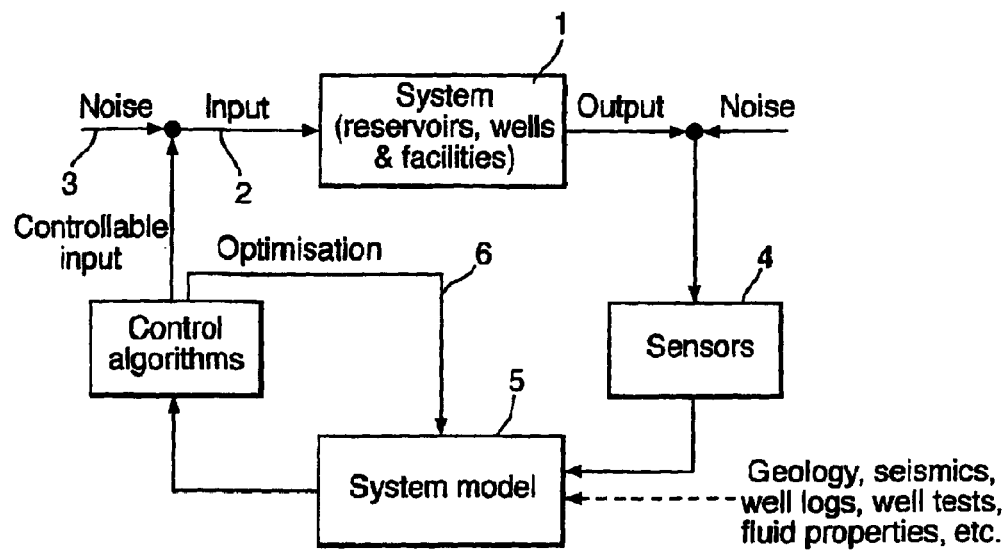
FIG. 1 is a schematic representation of a reservoir management process represented as a model-based closed-loop controlled process.

FIG. 1 schematically depicts an oil and/or gas reservoir management method as a model-based controlled process.

The system 1, at the top of FIG. 1, may comprise of one or more reservoirs, wells and facilities. The state of the system 1 (i.e. the pressures and saturations in the reservoirs, the pressures and phase rates in the wells, etc.) is only known to a very limited extent from the measured output of various sensors 4 at surface or down hole, and from more indirect measurements such as time-lapse seismics. Not only are measurements scarce, but they also contain noise. Also the input 2 to the system is only known to a limited extent (e.g. water injection rates or gas lift rates may be roughly known, but aquifer support may be a major unknown). The unknown inputs can also be interpreted as noise 3. Before production starts, no measurements are available and the proposed system control, i.e. the field development plan, must therefore be based on static and dynamic reservoir models 5 built on data from outcrop studies, seismics, well tests etc. During the early producing life of the reservoir, production data become available which are then used to manage day-to-day operations. E.g. production test data and wellhead pressure readings are used to control oil and gas production to meet daily targets, although often without any form of formal system model. However, the longer-term reservoir management is usually still based on the original reservoir model 5 without taking into account production data. I.e. the longer-term process control is performed without feedback 6, or in other words in open-loop. In order to make use of measured production data to change reservoir management to a closed-loop controlled process, it is useful to first address the different ways that measured data are used in classical measurement and control theory. In many industries where process control plays a role, the properties of the system are relatively well known, but the state variables, i.e. the internal process variables, cannot be measured directly. In that case the system model, with known parameters, is used as an observer of the states that are inaccessible to direct measurements, to allow closed-loop control of the system. A different situation occurs if the system parameters are not well known. This prompts another use of measured inputs and outputs, namely to identify the value of the unknown system parameters, or to update their values over time. In its most extreme form the system model is nothing more than a mathematical relationship between the inputs and the outputs. Such identified system models are often called data-driven or black-box models, as opposed to white-box models which are primarily based on known relationships such as conservations laws. Also white-box models, however, often contain a number of parameters that need to be 'tuned', using measured input and output data.

An example of closed-loop reservoir management using a black-box model is the use of decline curves to predict future well and reservoir performance. Also material balance models could be classified as black-box, although the presence of some physics in the form of a mass balance could arguably make them grayish. Finite difference or finite-element reservoir models, based on physics such as conservation of mass, Darcy's law and vapor-liquid equilibrium, certainly classify as white-box models. Because of geological uncertainties they are usually only a very crude approximation of reality, and the model parameters, such as permeabilities and porosities, are only known with a large degree of uncertainty. Therefore the predictive value of such reservoir models is limited and tends to deteriorate over time. This sometimes leads to attempts to 'history match' the model by adapting model parameters such that predicted results approach measured production data. This is of course a form of model updating meant to improve the predictive capacity of the model, and management of a reservoir based on history-matched models could therefore be considered closed-loop reservoir management.

Unfortunately, traditional history matching suffers from a number of drawbacks:
1) It is usually only performed on a campaign basis, typically after periods of years.
2) The matching techniques are usually ad-hoc and involve manual adjustment of model parameters, instead of systematic parameter updating.
3) Uncertainties in the state variables, model parameters and measured data are usually not explicitly taken into account.
4) The resulting history-matched models often violate essential geological constraints.
5) The updated model may reproduce the production data perfectly but have no predictive capacity because it has been over-fitted by adjusting a large number of unknown parameters using a much smaller number of measurements. True closed-loop reservoir management would require a shift from such campaign-based ad-hoc history matching to a much more frequent systematic updating of system models, based on data from different sources, while honoring geological constraints and the various sources of uncertainty.

The present invention concerns the combined use of model-based optimization, model updating techniques and model reduction techniques, while focusing the modeling efforts on those aspects than can be observed and controlled.

Figure 2:
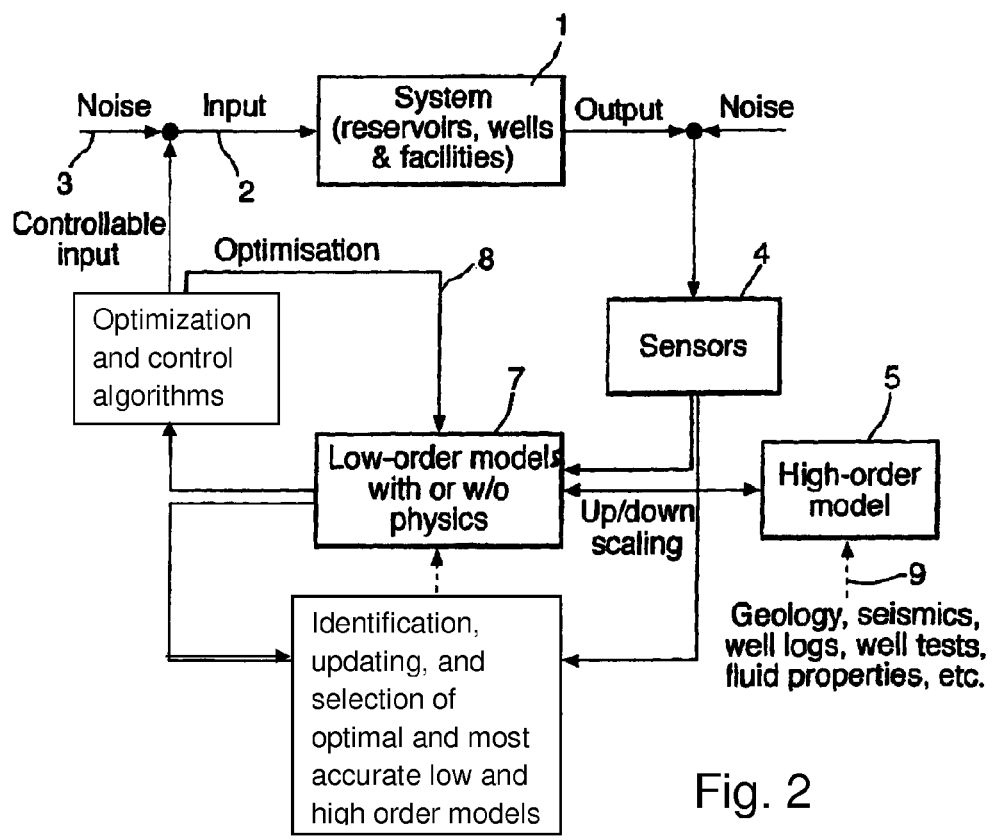
FIG. 2 is a schematic representation of a reservoir management process in which the method according to the invention is applied.

FIG. 2 is a schematic representation of the method according to the invention, displaying various elements of closed-loop reservoir management. The various process elements are described in more detail hereinbelow.

The bottom of FIG. 2 reflects the updating and optimization 8 of a low-order system model 7 based on data from different sources (e.g. production sensors 4, time-lapse and/or passive seismics 9, remote sensing). Two classes of updating (or "data-assimilation") methods for updating of the low-order reservoir model 7 may be used, which methods are known as Variational methods and Kalman filtering.

The Variational methods are used in the E&P and other industries and aim at minimizing an objective function defined in terms of the differences between measurements and model forecasts over a certain time period, through systematically adapting system parameters. This transforms the updating problem to an optimization problem for which many mathematical techniques are available. For systems with a large number of state variables, the most efficient optimization methods are those using an adjoint set of equations.

Kalman filtering was originally developed in the 1960's for tracking of flying objects with radar, Ordinary Kalman filtering is only applicable to linear systems. A recent development known as ensemble Kalman filtering allows application to large-scale nonlinear systems. The technique updates the uncertainty in the state vector every time a new measurement becomes available. To a certain extent, also uncertain parameters can be updated. The application of Kalman filtering to reservoir engineering has been described in SPE papers:

"Near-well reservoir monitoring through ensemble Kalman filter: Reservoir monitoring and continuous model updating using ensemble Kalman filter," paper SPE 75235 presented by G. Naevdal et al. at the SPE/DOE Thirteenth Symposium on Improved Oil Recovery, Tulsa, Okla., USA, 13-17 Apr. 2002; and "Reservoir monitoring and continuous model updating using ensemble Kalman filter," paper SPE 84372 presented by G. Naevdal et al. at the 2003 SPE Annual Technical Conference and Exhibition, Denver, Colo., USA, 5-8 October.

A second element of closed-loop reservoir management is systematic optimization of reservoir exploitation strategies. This involves both optimization in a given configuration, e.g. optimizing the injection and production rates in smart well segments, and in a free configuration, e.g. determining the optimal position of sidetracks or infill wells. A lot of production optimization efforts in the E&P industry are focused on short-term time scales. Instead the method according to the invention may focus on optimization over the entire producing life of the reservoir with the aim to optimize ultimate recovery or present value. In particular, a gradient-based optimization routine may be used where the derivative information is obtained through the use of an adjoint equation as described in SPE paper 78278 "Dynamic Optimisation of Water Flooding with Smart Wells Using Optimal Control Theory" presented by D. R. Brouwer and J. D. Jansen at the SPE 13th European Petroleum Conference, Aberdeen, Scotland, UK, 29-31 Oct. 2002.

The plain combination of optimization and updating has several theoretical and practical drawbacks as will be described below A better approach is to include a third element, consisting of reduction of the high-order reservoir model 5 to the appropriate level of detail in a low-order model 6. The reasons for this improvement are:

With increasing computer capacities reservoir models have become more complex and consist of an increasing number of variables (typically in the order of $10^4$-$10^6$). Optimizing the injection and production rates requires several passes of forward simulation of the reservoir model and backward simulation of an adjoint system of equations. The time needed to calculate optimized controls increases with the number of grid blocks and the complexity of the reservoir model. For large reservoir models this may be prohibitively time consuming, especially if several potential well configurations have to be investigated.

A problem with updating of the reservoir model 5 based on measured data, is that there are usually more parameters than there are observations, and therefore many combinations of parameter changes may lead to the same result. Normally it is tried to overcome this problem by constraining the solution space for the model parameters through the addition of regularization terms to the objective function. Reduced-order models provide an alternative to this process. If the reduced model has just as many, or less, parameters than observations, the updating problem has a well defined solution.

In many cases the controllable and observable subspaces of the total system state space are rather small. Modeling to a level of detail that can neither be observed nor controlled, is at best wasted effort, but, worse, may lead to wrong results.

The present invention can be implemented with various system-theoretical model reduction techniques leading to physical or non-physical reduced order models 7.

In particular the use of "Proper Orthogonal Decomposition" or "POD" (also known as "Karhunen-Loéve decomposition", "Principal Component Analysis", "Hotelling transformation", or the "method of Empirical Orthogonal Functions") is a suitable reduction technique. A more detailed description of POD will be provided below.

The concept of closed-loop reservoir management according to the invention as shown in FIG. 2 can be applied to different reservoir drainage concepts. It is particularly attractive for application in flooding with miscible or immiscible displacing fluids, or enhanced oil recovery through the injection of steam and/or surfactants. More in particular one can distinguish:

Waterflooding

Gas flooding (miscible or immiscible)

Gas-oil gravity drainage (GOGD)

Water-alternating-gas flooding (miscible or immiscible)

Simultaneous water and gas flooding (SWAG)

Steam flooding

Steam assisted gravity drainage (SAGD), including the VAPEX process

Surfactant flooding

Polymer flooding

The concept of closed-loop reservoir management as described above can be used to achieve a specific objective. In particular the objective may be specified as:

Maximizing the Net Present Value of the reservoir development over a certain timespan or for a certain amount of fluid injected.

Maximizing the Ultimate Recovery of the reservoir over a certain time span or for a certain amount of fluid injected.

Minimizing the difference in arrival times of the displacing fluid at the production wells in a displacement situation.

The conversion of a high-order reservoir model 5 into a low-order reservoir mode 7 by Proper Orthogonal Decomposition (POD) is preferably done as follows.

POD is a technique developed in the fluid mechanics community to describe 'coherent structures' which represent low-order dynamics of turbulent flow. A transformation $\Phi$ based on the covariance data of the non-linear high-order reservoir model is found and used to reduce the model. A high-order nonlinear reservoir model in discrete time is symbolically represented as $$x(k+1)=f(x(k+1),x(k),u(k)) \quad (1)$$

Here k is discrete time, x is the state vector of length n which typically contains the pressures and saturations in the gridblocks of the high-order reservoir model, f is a vector function and u is the input vector that represents imposed well flow rates or, more generally, controls such as valve settings in the wells or at surface. We now apply the POD transformation, which can be defined in three steps. First, state-sequences of the high-order model x(i), referred to as snapshots, are collected by means of simulation of the high-order model for $\kappa$ time steps in a data matrix X:

$$X=[x(1)x(2)\ldots x(\kappa)] \quad (2)$$

Typically, $\kappa \ll n$ and X is a tall $n \times \kappa$ matrix. If the state-sequences are generated by sufficiently exciting input signals, they incorporate to a certain extent the non-linear behavior of the high-order model. The vectors x(i) can be normalized by subtraction of the mean $$\bar{x} = (1/\kappa)\sum_{i=1}^{\kappa} x(i):$$

(3) $\quad X'=[x(1)-\bar{x}\, x(2)-\bar{x} \ldots x(\kappa)-\bar{x}],$ in which case the n×n matrix $R'=X'X''^T/\kappa-1$) is the co-variance matrix of state variables as captured by the snapshots. It can be shown that the eigenvectors of the following eigenvalue problem:

$$R_n p = l_p \quad (4)$$

determine principal directions in the projected state space that best fit the collected state snapshots, measured in terms of the relative 'energy', i.e. mean square fluctuations, associated with particular directions in the state space. Because generally $\kappa \ll n$, the rank of Rn can be at most $\kappa$ ($\kappa-1$ if X' is used) and therefore it is sufficient to solve the much smaller eigenvalue problem $$q^T R_\kappa = l q^T, \quad (5)$$

where $R_\kappa = X^T X$ is a $\kappa \times \kappa$ matrix. We can now define $$\Lambda_n = P^T X X^T P \text{ and } \Lambda_k = Q X^T X Q^T \quad (6, 7)$$

where $\Lambda_n$ and $\Lambda_\kappa$ are n×n and κ×κ diagonal matrices with ordered eigenvalues $\lambda_i$ on the diagonal, P and Q are n×n and κ×κ orthogonal matrices containing the eigenvectors p and q as columns and rows respectively, and where we have used the transpose instead of the inverse because $R_n$ and $R_\kappa$ are symmetric and therefore the eigenvectors are orthogonal. The required (right) eigenvectors p can be obtained from the (left) eigenvectors q with the aid of the relationship $$P = X Q \Lambda_k^{-1/2} \quad (8)$$

This is equivalent to computing the eigenvectors p through the use of the singular value decomposition (SVD) of the data matrix:

$$X = P \Sigma Q^T, \quad (9)$$

where the n×κ matrix Σ is given by $$\Sigma = \begin{bmatrix} \sigma_1 & 0 & \cdots & 0 \\ 0 & \sigma_2 & \cdots & 0 \\ \vdots & \vdots & \ddots & \vdots \\ 0 & 0 & \cdots & \sigma_\kappa \\ \vdots & \vdots & \ddots & \vdots \\ 0 & 0 & \cdots & 0 \end{bmatrix} \quad (10)$$

Here $\sigma_1 \geq \ldots \geq \sigma_l \gg \sigma_{l+1} \geq \ldots \geq \sigma_\kappa \geq 0$ are called the singular values of X and are the square roots of the eigenvalues $\lambda_i$, i=1, 2, ..., κ. It is simply verified that equations (6) and (7) can be obtained from equation (9), by working out the matrix products $XX^T$ and $X^T X$. The required transformation Φ is now defined as the first l columns of P, where the cut-off point l depends on the magnitude of the singular values. An often followed approach is to choose an l for which $$\sum_{i=1}^{l} \lambda_i \Big/ \sum_{i=1}^{\kappa} \lambda_i \geq \alpha \quad (11)$$

where α is close to one; typically α=0.95. Setting x≈Φz, the non-linear low-order model is given by:

$$z(k+1) = \Phi^T f(\Phi z(k), u(k)), y(k+1) = C_d \Phi z(k) \quad (12)$$

The reduced low-order model (12), which is represented as item 7 in FIG. 2 is 'optimal' in the sense that this representation of the dynamic system, using basis functions obtained by POD, has a smaller mean square error than a representation by any other basis of the same dimension.

It is preferred that one of the low order mathematical models is a non-linear low-order model derived from the higher order physical reservoir model by a mathematical reduction technique known as proper orthogonal decomposition or POD. In such case in at least one high order reservoir model the underground hydrocarbon containing formation may be represented as a layer of m×n gridcells, which each have an estimated porosity, permeability, initial pressure and initial saturation and wherein the non-linear low-order model is characterized by the equations:

$$z(k+1) = \Phi^T f(\Phi z(k), u(k)), y(k+1) = C_d \Phi z(k)$$

in which k is discrete time, z is the reduced-order state vector, Φ is the transformation matrix to convert the high-order model to the low-order model, f is the high-order model, u are the controls. y is the modelled output and $C_d$ is a matrix that determines which state variables are accessible to measurement.

It is furthermore preferred that at least one other low order mathematical reservoir model is a linear low-order model derived from the higher order physical reservoir model by mathematical reduction techniques known as subspace identification, modal decomposition, balanced realization or a combination of modal decomposition and balanced realization.

It is also preferred that the monitored physical properties of hydrocarbon and other fluids are the pressure and/or temperature and/or flux and/or composition and/or saturation of said hydrocarbon and/or other fluids and that also physical properties of the surrounding rock are monitored, which include the density and/or permeability and/or porosity and/or stress and/or strain of and/or acoustic velocity within the surrounding rock.

The optimal combination of high order and/or low order mathematical reservoir models may be assessed by an objective function J. in which monitored physical fluid properties are represented as $Ym_1, Ym_2, Ym_3, \ldots Ym_n$ and the physical fluid properties calculated by the different high order reservoir models are represented as $Yc_1, Yc_2, Yc_3, \ldots Yc_n$ and the optimal combination of different high order and/or low order reservoir models generates an optimal combination of physical fluid properties, and:

$$J = \sqrt{\{(Ym_1 - Yc_1)^2 + (Ym_2 - Yc_2)^2 + (Ym_3 - Yc_3)^2 + (Ym_n - Yc_n)^2\}}.$$

Optionally, the optimization algorithm optimizes at least one parameter, which characterizes the flux of fluids through the hydrocarbon bearing formation towards the wells on the basis of an adjoint set of equations.

The underground formation may comprise water and hydrocarbons, and in such case the optimization algorithm may induces the production control assemblies to control the production of hydrocarbons with the objective to maximize hydrocarbon recovery or economic value over the producing life of the reservoir.

Alternatively, the optimization algorithm may induce the production control assemblies to dynamically vary flux of fluids from the hydrocarbon fluid containing formation into different wells such that the selected optimal mathematical reservoir model, or selected optimal combination of such models, indicates that effects of water and gas coning resulting from influx of water and gas from adjacent gas and water bearing formations into the hydrocarbon liquid containing formation is inhibited and/or controlled.

A stimulating fluid may be injected into the formation via a plurality of fluid injection wells and in such case the mathematical models may each calculate the migration of the injected fluid through the formation towards each of the production wells and the optimization algorithm may induce the production control assemblies to control the migration of the injected fluid such that the selected optimal mathematical reservoir model, or selected optimal combination of such models, indicates that hydrocarbon recovery or economic value over the producing life of the reservoir is maximized.

If a stimulating fluid is injected into the formation via a plurality of fluid injection wells then the mathematical reservoir models may each calculate the migration of the injected fluid through the formation towards each of the production wells and the optimization algorithm may induce the production control assemblies to control the migration of the injected fluid such that the data provided by the selected optimal mathematical reservoir model, or selected optimal combination of such models, indicate that each of the injected fluids will reach each of the production wells simultaneously.

Optionally, the injected fluid comprises alternating slugs of water and gas and the fluid injection is controlled by the optimization algorithm such that the data provided by the selected optimal mathematical reservoir model, or selected optimal combination of such models, indicate that each of the injected fluids will substantially simultaneously reach each of the production wells.

These and other features, advantages and embodiments of the method according to the invention will be described in more detail and solely by way of example with reference to the accompanying drawings.

We claim:

1. A method of controlling production of hydrocarbon fluid from an underground hydrocarbon containing formation by means of a closed loop production control system in which:
   an assembly of monitoring sensors monitor the flux or other physical properties of hydrocarbon or other fluids within the formation;
   a plurality of mathematical reservoir models calculate each an estimate of the flux or other physical properties of hydrocarbon and other fluids within the formation;
   the mathematical reservoir models are each iteratively updated in response to data provided by the assembly of sensors such that any difference between the properties monitored by the assembly of sensors and those calculated by each of the reservoir models is minimized;
   an optimal mathematical reservoir model or an optimal combination of mathematical reservoir models is selected during at least one updating step for which an averaged difference between the calculated properties and the properties monitored by the assembly of sensors is minimal, and
   an optimization algorithm controls, on the basis of data provided by the selected optimal mathematical reservoir model or optimal combination of mathematical reservoir models, production control assemblies of a plurality of wells which traverse the hydrocarbon containing formation;
   wherein a plurality of low order mathematical reservoir models, which are derived from one or more high order mathematical reservoir models by different mathematical reduction techniques, calculate each an estimate of the flux or other physical properties of hydrocarbon or other fluids within the formation;
   the low order mathematical reservoir models are each iteratively updated in response to data provided by the assembly of sensors such that any difference between the properties monitored by the assembly of sensors and those calculated by each of the low order mathematical reservoir models is minimized;
   an optimal low order mathematical reservoir model or an optimal combination of low order mathematical reservoir models is selected during at least one updating step for which an averaged difference between the calculated properties and the properties monitored by the assembly of sensors is minimal; and
   an optimization algorithm optimizes, on the basis of data provided by the selected optimal low order mathematical reservoir model or optimal combination of low order mathematical reservoir models, production control assemblies of a plurality of wells which traverse the formation.

2. The method of claim 1, wherein one of the low order mathematical reservoir models is a non-linear low-order model derived from the higher order mathematical reservoir models by a mathematical reduction technique known as proper orthogonal decomposition or POD.

3. The method of claim 2, wherein in at least one high order mathematical reservoir model modeling the underground hydrocarbon containing formation is represented as a layer of m×n gridcells, which each have an estimated porosity, permeability, initial pressure and initial saturation, and wherein the non-linear low-order model is described by the equations:

$$z(k+1)=\Phi^T f(\Phi z(k), u(k)), y(k+1)=C_d \Phi z(k)$$

in which k is discrete time, z is the reduced-order state vector, $\Phi$ is the transformation matrix to convert the high-order model to the low-order model, f is the high-order model, u are the controls, y is the modeled output and $C_d$ is a matrix that determines which state variables are accessible to measurement.

4. The method of claim 2, wherein at least one other low order mathematical reservoir model is a linear low-order model derived from the higher order mathematical reservoir models by mathematical reduction techniques known as subspace identification, model decomposition, balanced realization or a combination of model decomposition and balanced realization.

5. The method of claim 1, wherein the monitored physical properties of hydrocarbon or other fluids comprise pressure, temperature flux, composition of said hydrocarbons, and saturation of said hydrocarbon or other fluids; wherein furthermore physical properties of the surrounding rock are monitored, wherein said furthermore physical properties comprise density, permeability, porosity, stress, strain of, and acoustic velocity within the surrounding rock.

6. The method of claim 1, wherein an optimal combination of high order or low order mathematical reservoir models is assessed by a objective function J, in which monitored physical fluid properties are represented as $Ym_1, Ym_2, Ym_3, \ldots Ym_n$ and the physical fluid properties calculated by the different high order mathematical reservoir models are represented as $Yc_1, Yc_2, Yc_3, \ldots Yc_n$ and the optimal combination of different high order or low order mathematical reservoir models generates an optimal combination of physical fluid properties, and:

$$J = \sqrt{\left\{ \begin{array}{l} (Ym_1 - Yc_1)^2 + (Ym_2 - Yc_2)^2 + \\ (Ym_3 - Yc_3)^2 + (Ym_n - Yc_n)^2 \end{array} \right\}}.$$

7. The method of claim 1, wherein the optimization algorithm optimizes at least one parameter, wherein the flux of fluids through the hydrocarbon bearing formation migrates towards the wells on the basis of an adjoint set of equations.

8. The method of claim 1, wherein the underground formation comprises water and hydrocarbons, and the optimization algorithm induces the production control assemblies to control the production of hydrocarbons with the objective to maximize hydrocarbon recovery or economic value over the producing life of the reservoir.

9. The method of claim 1, wherein the optimization algorithm induces the production control assemblies to dynamically vary the flux of fluids from the hydrocarbon fluid containing formation into different wells such that the data provided by the selected optimal mathematical reservoir model, or selected optimal combination of such models, indicate that effects of water and gas coning resulting from influx of water and gas from adjacent gas and water bearing formations into the hydrocarbon fluid containing formation is inhibited or controlled.

10. The method of claim 1, wherein a fluid is injected into the formation via a plurality of fluid injection wells and the mathematical models each calculate the migration of the injected fluid through the formation towards each of the production wells and optimization algorithm induces the production control assemblies to control the migration of the injected fluid such that the selected optimal mathematical reservoir model, or selected optimal combination of such models, indicates that hydrocarbon recovery or economic value over the producing life of the reservoir is maximized.

11. The method of claim 1, wherein a fluid is injected into the formation via a plurality of fluid injection wells and the mathematical reservoir models each calculate the migration of the injected fluid through the formation towards each of the production wells and the optimization algorithm induces the production control assemblies to control the migration of the injected fluid such that the data provided by the selected optimal mathematical reservoir model, or selected optimal combination of such models, indicate that each of the injected fluids will reach each of the production wells simultaneously.

12. The method of claim 11, wherein the injected fluid comprises alternating slugs of water and gas and the fluid injection is controlled by the optimization algorithm such that the data provided by the selected optimal mathematical reservoir model, or selected optimal combination of such models, indicate that each of the injected fluids will substantially simultaneously reach each of the production wells.

* * * * *